(12) United States Patent
Xu et al.

(10) Patent No.: US 11,114,641 B2
(45) Date of Patent: Sep. 7, 2021

(54) DISPLAY PANEL HAVING THIN FILM LAYERS WITH RECESSES AND PROTRUSIONS

(71) Applicant: Bazhou Yungu Electronics Technology Co., Ltd., Langfang (CN)

(72) Inventors: Yiying Xu, Langfang (CN); Enting Zhao, Langfang (CN); Yuansheng Sun, Langfang (CN); Xiangwei Zhang, Langfang (CN)

(73) Assignee: Bazhou Yungu Electronics Technology Co., Ltd., Langfang (CN)

( * ) Notice: Subject to any disclaimer, the term of this patent is extended or adjusted under 35 U.S.C. 154(b) by 0 days.

(21) Appl. No.: 16/893,689

(22) Filed: Jun. 5, 2020

(65) Prior Publication Data

US 2020/0313117 A1 Oct. 1, 2020

Related U.S. Application Data

(63) Continuation of application No. PCT/CN2019/075759, filed on Feb. 21, 2019.

(30) Foreign Application Priority Data

Sep. 30, 2018 (CN) .......................... 201811162876.0

(51) Int. Cl.
*H01L 51/52* (2006.01)
*H01L 51/00* (2006.01)
(Continued)

(52) U.S. Cl.
CPC ...... *H01L 51/5253* (2013.01); *H01L 27/3244* (2013.01); *H01L 51/0097* (2013.01);
(Continued)

(58) Field of Classification Search
CPC ............ H01L 51/5253; H01L 51/0097; H01L 27/3244; H01L 2251/301; H01L 2251/50;
(Continued)

(56) References Cited

U.S. PATENT DOCUMENTS 7,176,621 B2 * 2/2007 Do ..................... H01L 51/5271
  313/498
8,946,747 B2 * 2/2015 Reiherzer ............. H01L 33/505
  257/98
(Continued)

FOREIGN PATENT DOCUMENTS

CN 105206763 A 12/2015
CN 106684256 A 5/2017
(Continued)

OTHER PUBLICATIONS

International Search Report dated Jul. 4, 2019 in corresponding International application No. PCT/CN2019/075759; 2 pages.
(Continued)

*Primary Examiner* — Ida M Soward
(74) *Attorney, Agent, or Firm* — Maier & Maier, PLLC (57) ABSTRACT

The present disclosure discloses a display panel. The display panel may include multiple thin film layers. The multiple thin film layers may include a first layer and a second layer adjacent to the first layer. The first layer may define a recess at a face toward the second layer. The second layer may include a protrusion at a face toward the first layer. The protrusion may be engaged in the recess. A diameter of a tip of the protrusion may be larger than a diameter of a root of the protrusion. A shape of a space in the recess may match with a contour of the protrusion.

15 Claims, 5 Drawing Sheets

(51) Int. Cl.
  *H01L 27/32* (2006.01)
  *H01L 33/54* (2010.01)
  *H01L 33/24* (2010.01)
(52) U.S. Cl.
  CPC .............. *H01L 33/24* (2013.01); *H01L 33/54* (2013.01); *H01L 2251/301* (2013.01); *H01L 2251/50* (2013.01); *H01L 2251/5338* (2013.01)
(58) Field of Classification Search
  CPC .. H01L 33/54; H01L 33/24; H01L 2251/5338
  See application file for complete search history.

(56) References Cited

U.S. PATENT DOCUMENTS

| | | | | |
|---|---|---|---|---|
| 9,013,099 | B2* | 4/2015 | Wang | H01L 51/5256 |
| | | | | 313/506 |
| 9,070,889 | B2* | 6/2015 | Lee | H01L 51/5237 |
| 9,257,674 | B2* | 2/2016 | Lee | H01L 51/5268 |
| 9,871,081 | B2* | 1/2018 | Kim | H01L 27/3223 |
| 10,079,362 | B2* | 9/2018 | Kim | H01L 51/5268 |
| 10,128,462 | B2* | 11/2018 | Son | H01L 51/5259 |
| 10,177,344 | B2* | 1/2019 | Wang | H01L 51/5268 |
| 10,181,578 | B2* | 1/2019 | Li | H01L 51/56 |
| 10,243,174 | B2* | 3/2019 | Li | H01L 51/529 |
| 10,297,794 | B2* | 5/2019 | Sung | H01L 51/5237 |
| 10,629,851 | B2* | 4/2020 | Chen | H01L 51/52 |
| 10,868,271 | B2* | 12/2020 | Nishizaki | H01L 51/56 |
| 2016/0268555 | A1* | 9/2016 | Nishimura | H01L 51/5275 |
| 2016/0301034 | A1* | 10/2016 | Hsu | H01L 51/5275 |
| 2016/0365539 | A1* | 12/2016 | Wang | H01L 27/3272 |
| 2017/0117504 | A1* | 4/2017 | Kim | H01L 27/3244 |
| 2018/0151833 | A1* | 5/2018 | Riegel | H01L 51/5253 |

FOREIGN PATENT DOCUMENTS

| | | | | |
|---|---|---|---|---|
| CN | 107394059 A | | 11/2017 | |
| CN | 206610830 U | * | 11/2017 | |
| CN | 206610830 U | | 11/2017 | |
| CN | 108023028 A | | 5/2018 | |
| CN | 207441754 U | * | 6/2018 | |
| CN | 108539041 A | * | 9/2018 | |
| CN | 108539041 A | | 9/2018 | |
| CN | 109273507 A | | 1/2019 | |
| WO | WO-2016140130 A1 | * | 9/2016 | ......... H01L 51/5256 |
| WO | WO-2016147645 A1 | * | 9/2016 | ............... G09F 9/30 |

OTHER PUBLICATIONS

Chinese First Official Action and Written Opinion dated Jul. 10, 2019 in corresponding Chinese application No. 2018111628760; 15 pages.

Chinese Second Official Action and Written Opinion dated Dec. 27, 2019 in corresponding Chinese application No. 2018111628760; 12 pages.

* cited by examiner

DISPLAY PANEL HAVING THIN FILM LAYERS WITH RECESSES AND PROTRUSIONS

CROSS REFERENCE TO RELATED APPLICATION

The present application is a continuation-application of International (PCT) Patent Application No. PCT/CN2019/075759 filed on Feb. 21, 2019, which claims foreign priorities of Chinese Patent Application No. 201811162876.0, filed on Sep. 30, 2018 in the National Intellectual Property Administration of China, the entire contents of which are hereby incorporated by reference in their entireties.

TECHNICAL FIELD

The present disclosure relates to the field of display technology, and in particular relates to a display panel.

BACKGROUND

With the rapid growth of demand for portable mobile devices and wearable display products and the like, the flexible display technology has made great progress in recent years. Among display technologies that could perform flexible display, Organic Light-Emitting Diode (OLED) has excellent performances such as fast response speed, wide view angle, light weight, low power consumption, high brightness, etc., which make OLED display technology considered to be one of the most promising technologies in flexible display technology.

Multiple thin film layers could be provided in the flexible display panel. The flexible display panel has a function of being foldable. When the flexible display panel is bent multiple times, thin film layers in the flexible display panel could easily be peeled, thereby reducing the service life of the display panel.

SUMMARY OF THE DISCLOSURE

The technical problem mainly solved by this disclosure is to provide a display panel, which could enhance the bonding force between thin film layers of the display panel, thereby improving the dynamic bending resistance capability of the display panel, and better preventing the thin film layers from peeling.

In order to solve the technical problems mentioned above, a technical solution may be adopted in this disclosure. A display panel is provided. The display panel may include a plurality of thin film layers. The plurality of thin film layers may include a first layer and a second layer adjacent to the first layer. The first layer may define a recess at a face toward the second layer. The second layer may comprise a protrusion at a face toward the first layer. The protrusion may be engaged in the recess. A diameter of a tip of the protrusion may be larger than a diameter of a root of the protrusion. A shape of a space in the recess may match with a contour of the protrusion.

In some embodiments, a vertical cross-section outline of the protrusion may be a curved line.

In some embodiments, the vertical cross-section outline of the protrusion may include two side edges arranged symmetrically and an end edge connecting the two side edges. The side edge may include a first arc and a second arc connecting to each other. Opening directions of the first arc and the second arc may be opposite to each other.

In some embodiments, the display panel may include an organic light emitting layer and an encapsulation layer arranged on the organic light emitting layer. The encapsulation layer may include multiple thin film layers.

In some embodiments, the multiple thin film layers may include a first inorganic layer, an organic layer and a second inorganic layer stacked successively. The first inorganic layer may be in contact with the organic light emitting layer.

In some embodiments, the first inorganic layer may define multiple recesses, and the organic layer may define multiple recesses at side faces away from the organic light emitting layer. The second inorganic layer may provide multiple protrusions, and the organic layer may provide multiple protrusions at side faces toward the organic light emitting layer. A depth of the recesses of the first inorganic layer may be less than a depth of the recesses of the organic layer.

In some embodiments, an orthographic projection of the recess of the first inorganic layer on the organic light emitting layer and an orthographic projection of the recess of the organic layer on the organic light emitting layer may be misaligned.

In some embodiments, a distribution density of the recesses of the first inorganic layer and the organic layer corresponding to a middle region of the display panel may be larger than a distribution density of the recesses corresponding to an edge region around the middle region.

In some embodiments, a depth of the recesses of the first inorganic layer and/or the organic layer corresponding to a middle region of the display panel is larger than a depth of the recesses corresponding to an edge region around the middle region.

In some embodiments, the amount the first inorganic layers may be at least 2. The amount of the organic layers may be at least 2. The first inorganic layer and the organic layer may be alternatively arranged with each other.

In some embodiments, orthographic projections of the recesses of each layer of the first inorganic layers on the organic light emitting layer may be overlapped. Orthographic projections of the recesses of each layer of the organic layers on the organic light emitting layer may be overlapped.

In some embodiments, the first inorganic layer may provide multiple protrusions, and the organic layer may provide multiple protrusions at side faces away from the organic light emitting layer. The protrusions may be integrally formed with the corresponding first inorganic layer and the organic layer.

In some embodiments, the first inorganic layer may define multiple first recesses at side face away from the organic light emitting layer. The organic layer may provide multiple first protrusions at side face toward the organic light emitting layer. The first protrusions may be engaged in the first recesses.

In some embodiments, the organic layer may define multiple second recesses at a side face away from the organic light emitting layer. The second inorganic layer may provide multiple second protrusions at a side face close to the organic light emitting layer. The second protrusions may be engaged in the second recesses.

In some embodiments, a material of the first inorganic layer and a material of the second inorganic layer may be one of oxidation silicon, silicon nitride and silicon oxynitride. A material of the organic layer may be one of epoxy-based material and acrylic-based material.

The advantages of the present disclosure are: in the display panel of the present disclosure, the display panel includes a plurality of thin film layers. The plurality of thin film layers may include a first layer and a second layer adjacent to the first layer. The first layer may define a recess at a face toward the second layer. The second layer may comprise a protrusion at a face toward the first layer. The protrusion may be engaged in the recess. A diameter of a tip of the protrusion may be larger than a diameter of a root of the protrusion. A shape of a space in the recess may match with a contour of the protrusion. Therefore, the bonding force between thin film layers of the display panel could be increased, thus the thin film layers could be harder to be peeled when the display panel is bent, and the service life of the display panel could be increased.

DETAILED DESCRIPTION

Certain terms are used in the description and claims to refer to specific components, and those skilled in the art should appreciate that manufacturers may use different terms to refer to the same components. The present specification and claims do not use the difference in names to distinguish components, but rather use the difference in functions of components as a basis for distinguishing components. The present disclosure will be illustrated in detail hereafter in connection with figures and embodiments.

The display panel disclosed in the present disclosure could be used in a variety of display modes, such as OLED display, quantum dot display, Micro-LED display, etc. An OLED display is taken as an example for description herein.

The display panel disclosed in this disclosure is a bendable display panel, and a flexible display panel is taken as an example for description herein.

The display panel disclosed in the present disclosure may include multiple thin film layers. The multiple thin film layers may be arranged in an encapsulation layer of the display panel or in other regions of the display panel. The multiple thin film layers arranged in the encapsulation layer are taken as examples to illustrate the present disclosure hereafter.

Figure 1:
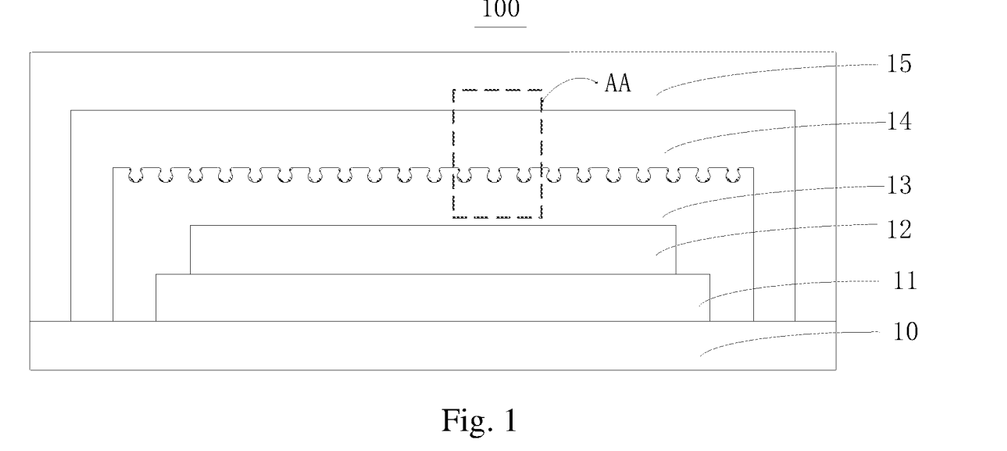
FIG. 1 is a schematic structural diagram of a display panel according to a first embodiment of the present disclosure.

FIG. 1 is a schematic structural diagram of a display panel according to a first embodiment of the present disclosure. As shown in FIG. 1, the display panel 100 may include a substrate 10, a drive layer 11, an organic light emitting layer 12, a first inorganic layer 13, an organic layer 14, and a second inorganic layer 15.

In this embodiment, the first inorganic layer 13, the organic layer 14, and the second inorganic layer 15 may constitute the encapsulation layer. That is, the encapsulation layer may include multiple layers, i.e., three thin film layers, which are the first inorganic layer 13, the organic layer 14, and the second inorganic layer 15 respectively.

The drive layer 11 may be disposed on the substrate 10. The organic light emitting layer 12 may be disposed on the drive layer 11. The first inorganic layer 13 may be in contact with the organic light emitting layer 12 and cover the organic light emitting layer 12. The organic layer 14 may cover the first inorganic layer 13. The second inorganic layer 15 may cover the organic layer 14. The first inorganic layer 13, the organic layer 14, and the second inorganic layer 15 may be stacked together to constitute an encapsulation thin film that encapsulates the organic light emitting layer 12.

Figure 2:
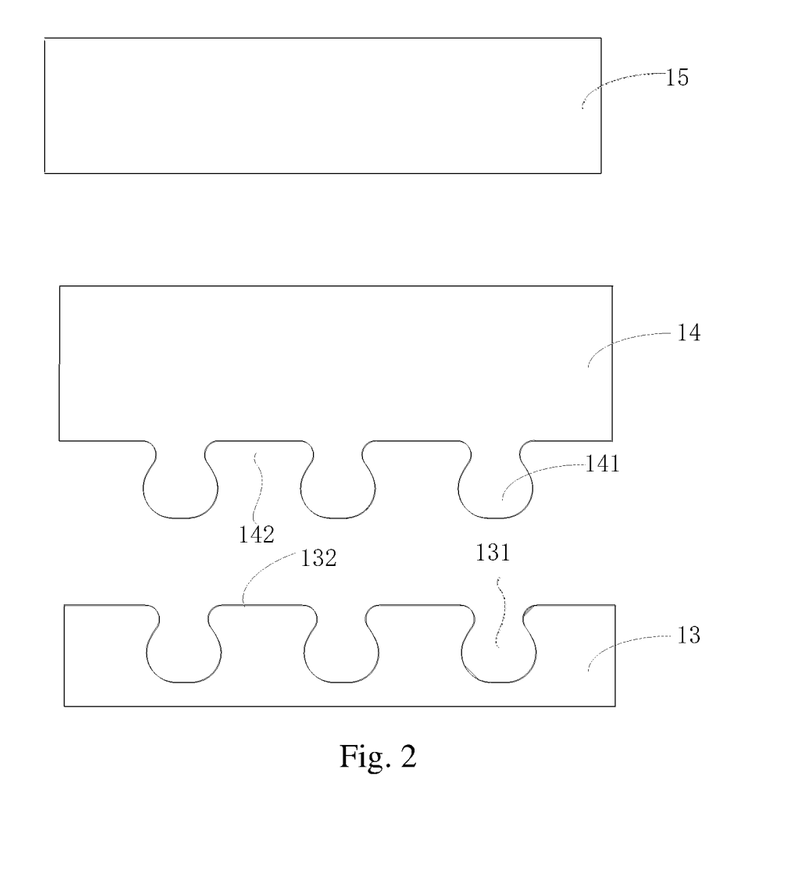
FIG. 2 is an explosive schematic structural diagram at AA in the display panel shown in FIG. 1.

Please also refer to FIG. 2, the first inorganic layer 13 may define multiple first recesses 131 on a side face away from the organic light emitting layer 12, and the organic layer 14 may have multiple first protrusions 141 on a side face close to the organic light emitting layer 12. The first protrusions 141 in the organic layer 14 may be engaged in the first recesses 131 in the first inorganic layer 13. A diameter of a tip of the first protrusion 141 may be larger than a diameter of a root of the first protrusion 141. The root of the first protrusion 141 is an end of the first protrusion connected to the organic layer 14. The tip of the first protrusion 141 is a free end of the first protrusion opposite to the root. A shape of a space in the first recess 131 may match with a contour of the first protrusion 141. The first inorganic layer 13 and the organic layer 14 may be engaged with each other through the concave-convex engagement between the first recesses 131 and the first protrusions 141, thus the bonding force between the first inorganic layer 13 and the organic layer 14 is enhanced, thereby peeling of the encapsulation thin film could be better avoided.

Figure 3:
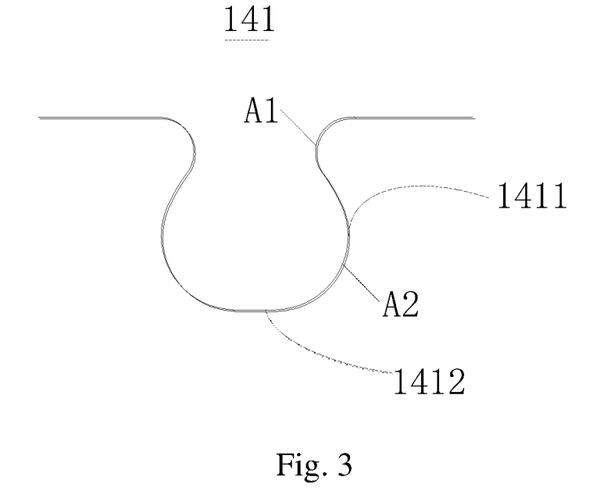
FIG. 3 is an enlarged schematic diagram of a first protrusion in the display panel shown in FIG. 1.

Please also refer to FIG. 3, vertical cross-section outlines of the first protrusions 141 may be curved lines. In some embodiments, a vertical cross-section outline of the first protrusion 141 may include two side edges 1411 arranged symmetrically and an end edge 1412 connecting the two side edges 1411. The end edge 1412 may be a straight line or a curved line. The side edge 1411 may include a first arc A1 and a second arc A2 connecting to each other. Opening directions of the first arc A1 and the second arc A2 may be opposite to each other. Such curved side edges 1411 could ensure that during a period when the display panel 100 is bended dynamically, the joints of the first inorganic layer 13 and the organic layer 14 are less likely to be damaged, so as to better avoid the peeling of the encapsulation thin film and further increase the service life of the display panel 100.

In some embodiments, in the first inorganic layer 13, the first recesses 131 may be evenly distributed. That is, the distribution density of the first recesses 131 is uniform. In alternative embodiments, the first recesses 131 may also be unevenly distributed. That is, the distribution density of the first recesses 131 is not uniform. When the distribution density of the first recesses 131 of the first inorganic layer 13 corresponding to a middle region of the display panel 100 is larger, and the distribution density of the first recesses 131 in an edge region around the middle region is smaller, such a density distribution pattern of the first recesses 131 could better offset the stress generated at the joint faces of the first inorganic layer 13 and the organic layer 14 when the display panel 100 is bent, so as to better avoid the peeling of the encapsulation thin film and improve the dynamic bending resistance capability of the display panel 100.

In some embodiments, in the first inorganic layer 13, depths of the first recesses 131 may be the same. In alternative embodiments, depths of the first recesses 131 may also be different. When the depths of the first recesses 131 of the first inorganic layer 13 corresponding to the middle region of the display panel 100 is larger and the depths of the first recesses 131 in the edge region around the middle region is smaller, such a depth distribution pattern of the first recesses 131 could better offset the stress generated at the joint faces of the first inorganic layer 13 and the organic layer 14 when the display panel 100 is bent, so as to better avoid the peeling of the encapsulation thin film and improve the dynamic bending resistance capability of the display panel 100.

Those skilled in the art will appreciate that, when the first inorganic layer 13 defines multiple first recesses 131, multiple protrusions 132 could be correspondingly created, and when the organic layer 14 forms multiple first protrusions 141, multiple recesses 142 could be correspondingly defined. The engagement between the recesses 142 of the organic layer 14 and the protrusions 132 of the first inorganic layer 13 may correspond to engagement through concave-convex engagement. Vertical cross-section outlines of the protrusions 132 may correspond to curved lines. Shapes of the vertical cross-sections of the protrusions 132 of the first inorganic layer 13 and the first protrusions 141 of the organic layer 14 may be different, such that the protrusions 132 of the first inorganic layer 13 and the first protrusions 141 of the organic layer 14 could be misaligned when snapping with each other, so that the bonding force between the first inorganic layer 13 and the organic layer 14 could be enhanced, and peeling of the encapsulation thin film could be better avoided.

In some embodiments, multiple protrusions 132 disposed on a side face of the first inorganic layer 13 away from the organic light emitting layer 12 may be integrally formed with the first inorganic layer 13. For example, multiple protrusions 132 may be formed by patterning a face of the first inorganic layer 13 after depositing the first inorganic layer 13. This could be achieved by: depositing the first inorganic layer 13; forming a patterned photoresist layer on the first inorganic layer 13 by deposition, exposure and development; and etching the first inorganic layer 13 to form multiple protrusions 132 and define multiple first recesses 131 by using the photoresist layer as a shielding layer. In alternative embodiments, multiple protrusions 132 disposed on the side face of the first inorganic layer 13 away from the organic light emitting layer 12 and the first inorganic layer 13 may be separately formed. For example, after the first inorganic layer 13 is deposited, multiple protrusions 132 may be formed on the face of the first inorganic layer 13 by using a mask plate having several through holes. This could be achieved by: depositing the first inorganic layer 13; placing a mask plate having several through holes on the first inorganic layer 13; and then using the mask plate to conduct deposition on a face of the first inorganic layer 13. A large amount of inorganic material is deposited in a region of the face of the first inorganic layer 13 corresponding to a region of the mask plate with through holes therein, therefor, corresponding to this region of the face of the first inorganic layer 13, protrusions 132 may be formed; no inorganic material or a few material is deposited in a region of the face of the first inorganic layer corresponding to a region of the mask plate without through holes therein, therefor, corresponding to this region of the face of the first inorganic layer, first recesses 131 may be defined.

In some embodiments, the material of the first inorganic layer 13 and the material of the protrusions 132 may be the same. In alternative embodiments, the material of the first inorganic layer 13 and the material of the protrusions 132 may be different. For example, the material of the first inorganic layer 13 and the material of the protrusions 132 may be one of silicon oxide, silicon nitride, and silicon oxynitride.

In some embodiments, the material of the organic layer 14 may be one of epoxy-based material and acrylic-based material.

In some embodiments, the material of the second inorganic layer 15 and the material of the first inorganic layer 13 may be the same. In alternative embodiments, the material of the second inorganic layer 15 and the material of the first inorganic layer 13 may also be different. For example, the material of the second inorganic layer 15 may be one of silicon oxide, silicon nitride, and silicon oxynitride.

Figure 4:
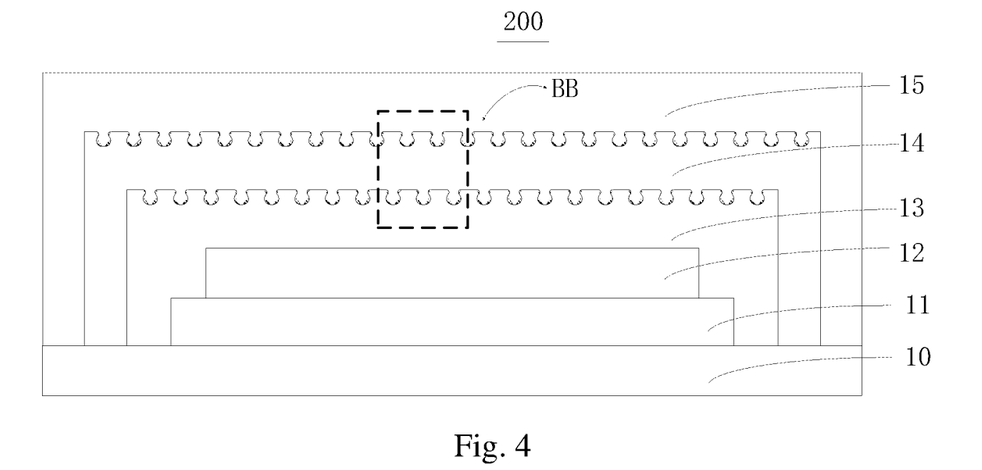
FIG. 4 is a schematic structural diagram of a display panel according to a second embodiment of the present disclosure, in which multiple second recesses 143 may be defined at a side face of the organic layer 14 away from the organic light emitting layer 12, multiple second protrusions 151 may be provided on a side face of the second inorganic layer 15 close to the organic light emitting layer 12.
Figure 5:
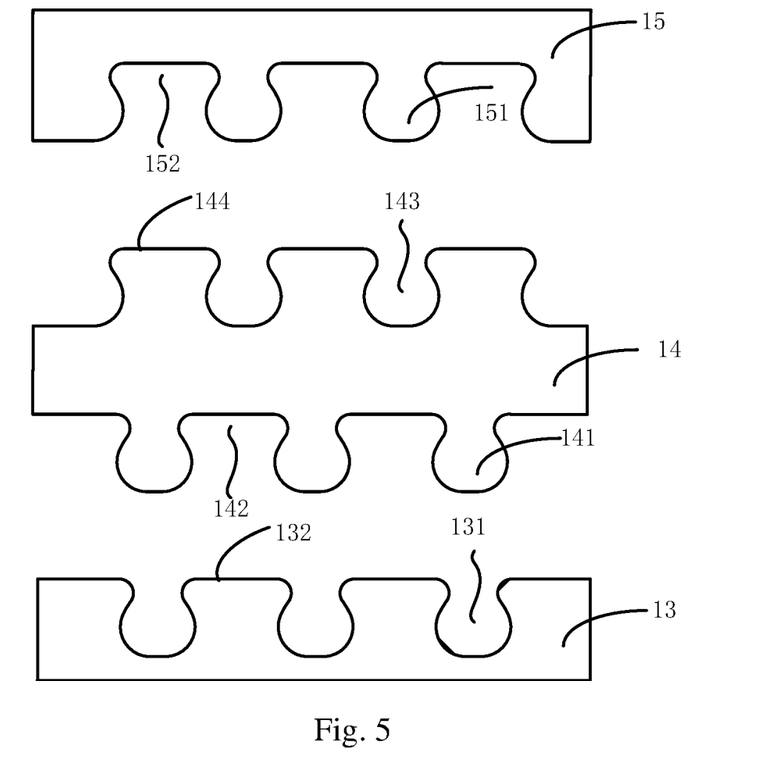
FIG. 5 is an explosive schematic structural diagram at BB in the display panel shown in FIG. 4.

FIG. 4 is a schematic structural diagram of a display panel 200 according to a second embodiment of the present disclosure. FIG. 5 is an explosive schematic structural diagram at BB in the display panel 200 shown in FIG. 4. As shown in FIG. 4 and FIG. 5, the difference between the display panel 200 and the display panel 100 is that: multiple second recesses 143 may be defined at a side face of the organic layer 14 away from the organic light emitting layer 12, multiple second protrusions 151 may be provided on a side face of the second inorganic layer 15 close to the organic light emitting layer 12.

The second protrusions 151 of the second inorganic layer 15 could be engaged in the second recesses 143 of the organic layer 14, which could enhance the bonding force between the organic layer 14 and the second inorganic layer 15, improve the dynamic bending resistance capability of the display panel 200, and better prevent the encapsulation thin film from peeling.

The second protrusions 151 may be like the first protrusions 141 in FIG. 2 and will not be detailed hereafter for the sake of brevity.

In some embodiments, shapes of the second protrusions 151 and shapes of the first protrusions 141 may be the same. In alternative embodiments, shapes of the second protrusions 151 and shapes of the first protrusions 141 may be different.

In some embodiments, a distribution density of the second protrusions 151 and a distribution density of the first protrusions 141 may be the same. In alternative embodiments, the distribution density of the second protrusions 151 may be greater than the distribution density of the first protrusions 141, such that the bonding force between the organic layer 14 and the second inorganic layer 15 may be greater than the bonding force between the first inorganic layer 13 and the organic layer 14, so that peeling of the encapsulation thin film could be better avoided.

In some embodiments, a depth of the second recess 143 of the organic layer 14 may be equal to a depth of the first recess 131 of the first inorganic layer 13. In alternative embodiments, the depth of the second recess 143 of the organic layer 14 may be greater than the depth of the first recess 131 of the first inorganic layer 13, such that the bonding force between the organic layer 14 and the second inorganic layer 15 may be greater than that of the first inorganic layer 13 and the organic layer 14, thus the peeling of the encapsulation thin film could be better avoided.

In some embodiments, an orthographic projection of the recesses 131 of the first inorganic layer 13 on the organic light emitting layer 12 and an orthographic projection of the second recesses 143 of the organic layer 14 on the organic light emitting layer 12 may be overlapped with each other. In alternative embodiments, the orthographic projection of the recesses 131 of the first inorganic layer 13 on the organic light emitting layer 12 and the orthographic projection of the second recesses 143 of the organic layer 14 on the organic light emitting layer 12 may be misaligned with each other, thus the peeling of the encapsulation thin film could be better avoided.

In some embodiments, in the organic layer 14, the second recesses 143 may be evenly distributed. That is, the distribution density of the second recesses 143 may be uniform. In alternative embodiments, the second recesses 143 may also be unevenly distributed. That is, the distribution density of the second recesses 143 may be not uniform. When the distribution density of the second recesses 143 of the organic layer 14 corresponding to the middle region of the display panel 200 is larger, and the distribution density of the second recesses 143 in the edge region around the middle region is smaller, such a density distribution pattern of the second recesses 143 could better offset the stress generated at the joint faces of the organic layer 14 and the second inorganic layer 15 when the display panel 200 is bent. Therefore, the dynamic bending resistance capability of the display panel could be better improved.

In some embodiments, in the organic layer 14, the depths of the recesses 143 may be the same. In alternative embodiments, the depths of the second recesses 143 may also be different. When the depth of the second recesses 143 of the organic layer 14 corresponding to the middle region of the display panel is larger, and the depth of the second recesses 143 in the edge region around the middle region is smaller, such a depth distribution pattern of the second recesses 143 could better offset the stress generated at the joint faces of the organic layer 14 and the second inorganic layer 15 when the display panel is bent, therefore, the dynamic bending resistance capability of the display panel could be better improved, and the peeling of the encapsulation thin film could be better avoided.

Those skilled in the art will appreciate that, when the organic layer 14 defines multiple second recesses 143, multiple protrusions 144 may be correspondingly created, and when the second inorganic layer 15 forms multiple second protrusions 151, multiple recesses 152 may be correspondingly defined. The engagement between the protrusions 144 of the organic layer 14 and the recesses 152 of the second inorganic layer 15 may correspond to concave-convex engagement. Vertical cross-section outlines of the protrusions 144 may be curved lines.

In some embodiments, multiple protrusions 144 disposed on a side face of organic layer 14 away from the organic light emitting layer 12 may be integrally formed with the organic layer 14. For example, multiple protrusions 144 and multiple second recesses 143 may be formed by patterning a face of the organic layer 14 after the organic layer 14 is sprayed. In alternative embodiments, multiple protrusions 144 disposed on a side face of the organic layer 14 away from the organic light emitting layer 12 may be separately formed. For example, after the organic layer 14 is sprayed, protrusions 144 could be formed and multiple second recesses 143 could be defined at the face of the organic layer 14 by a spray process with a mask plate defining multiple through holes.

In some embodiments, the material of the organic layer 14 and the material of the protrusions 144 may be the same. In alternative embodiments, the material of the organic layer 14 and the material of the protrusions 144 may be different. For example, the material of the organic layer 14 and the material of the protrusions 144 may be one of epoxy-based material and acrylic-based material.

Figure 6:
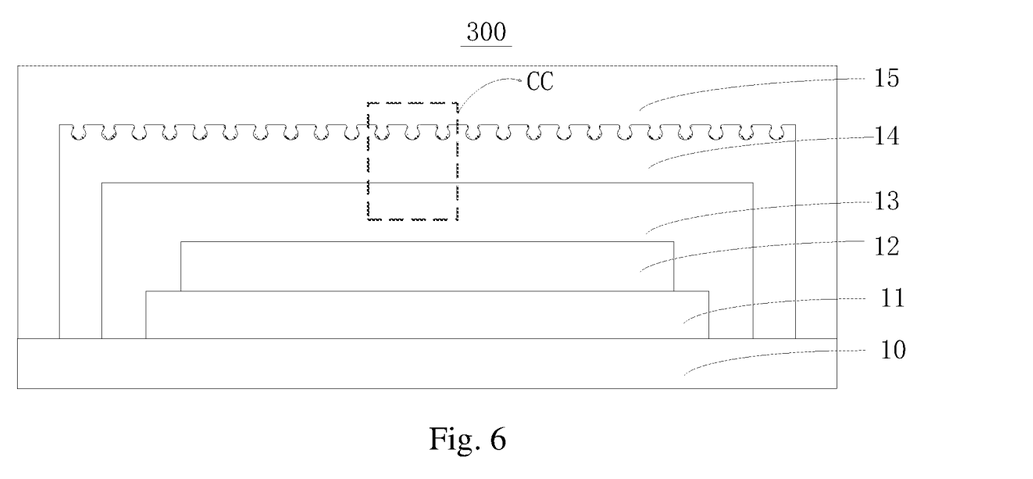
FIG. 6 is a schematic structural diagram of a display panel according to a third embodiment of the present disclosure, in which the first inorganic layer 13 of the display panel 300 does not define the first recesses 131, the organic layer 14 does not include the first protrusions 141. That is, in the display panel of this embodiment, the concave-convex engagement may only exist between the second recesses 143 of the organic layer 14 and the second protrusions 151 of the second inorganic layer 15.
Figure 7:
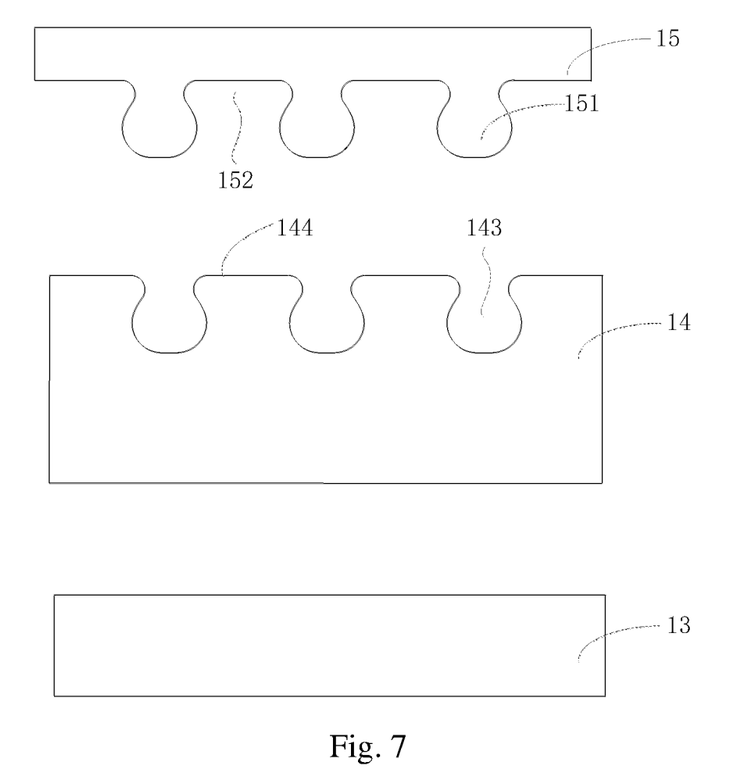
FIG. 7 is an explosive schematic structural diagram at CC in the display panel shown in FIG. 6.

FIG. 6 is a schematic structural diagram of a display panel 300 according to a third embodiment of the present disclosure. FIG. 7 is an explosive schematic structural diagram at CC in the display panel 300 shown in FIG. 6. As shown in FIG. 6 and FIG. 7, the difference between the display panel 300 and the display panel 200 may be that: the first inorganic layer 13 of the display panel 300 does not define the first recesses 131, the organic layer 14 does not include the first protrusions 141. That is, in the display panel 300, the concave-convex engagement may only exist between the second recesses 143 of the organic layer 14 and the second protrusions 151 of the second inorganic layer 15.

The display panels 300 shown in FIG. 1, FIG. 4 and FIG. 6 is illustrated by an example of an encapsulating layer including three thin film layers, that is an encapsulating layer including a first inorganic layer, an organic layer and a second inorganic layer stacked successively. But this is only schematic. In practical applications, the amounts of the organic and inorganic layers in the encapsulation layer and the arrangement sequence of the organic and inorganic layers in the encapsulation layer could be set according to the demands of various application scenarios. As long as they realize that the recesses are defined and the protrusions are formed on the layer faces of adjacent thin film layers and the concave-convex engagement may be formed between the recesses and the protrusions, they are all within the protection scope of the present disclosure. In addition, a case in which the three thin film layers may be disposed in other regions of the display panel than the encapsulation layer is also within the protection scope of this disclosure.

Figure 8:
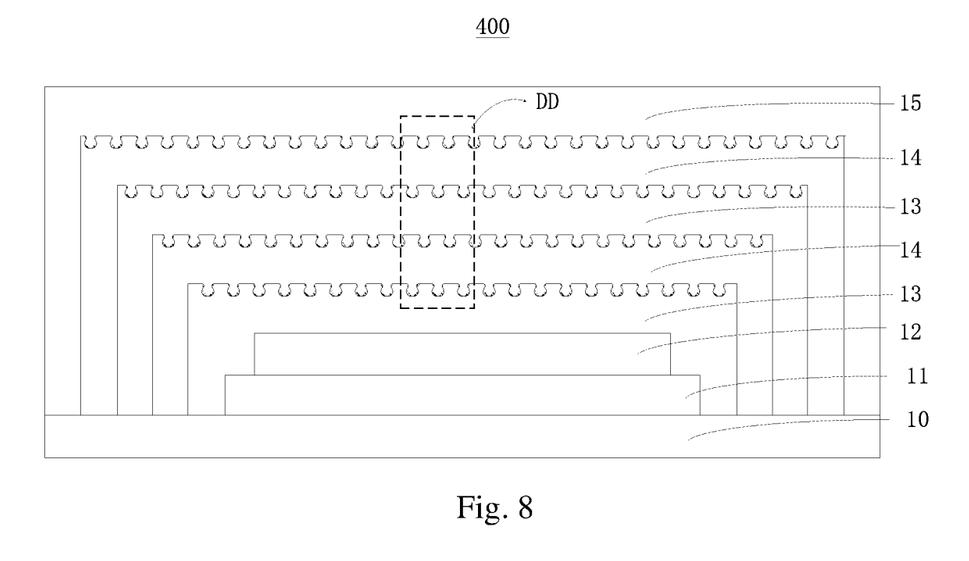
FIG. 8 is a schematic structural diagram of a display panel according to a fourth embodiment of the present disclosure, in which the amount of the first inorganic layers 13 is at least 2, and the amount of the organic layers 14 is at least 2, the first inorganic layer 13 and the organic layer 14 may be alternatively arranged with each other.
Figure 9:
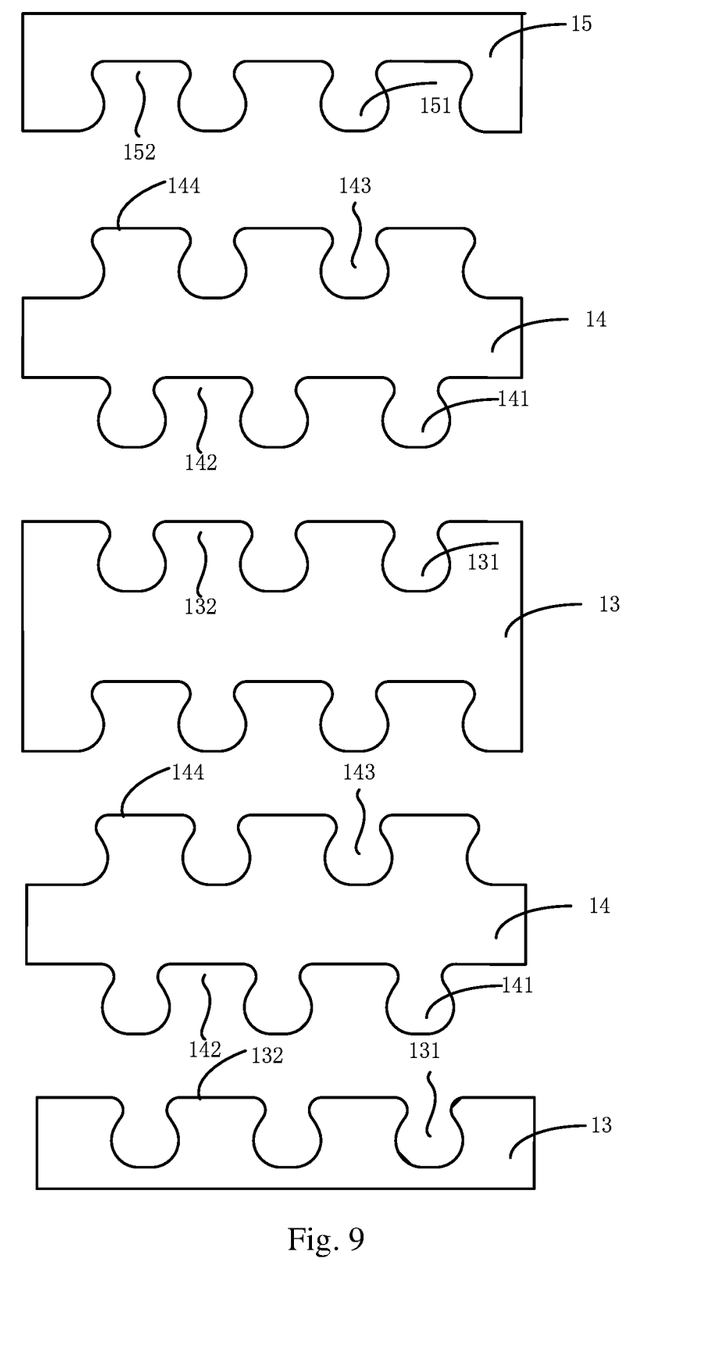
FIG. 9 is an explosive schematic structural diagram at DD in the display panel shown in FIG. 8.

FIG. 8 is a schematic structural diagram of the flexible display panel 400 according to the fourth embodiment of the present disclosure. FIG. 9 is an explosive schematic structural diagram at DD in the display panel 400 shown in FIG. 8. As shown in FIG. 8 and FIG. 9, the difference between the display panel 400 and the display panel 200 may be that: the amount of the first inorganic layers 13 is at least 2, and the amount of the organic layers 14 is at least 2, the first inorganic layer 13 and the organic layer 14 may be alternatively arranged with each other.

In some embodiments, orthographic projections of the recesses of each layer of the first inorganic layers 13 on the organic light emitting layer 12 may be overlapped. Orthographic projections of the recesses of each layer of the organic layers 14 on the organic light emitting layer 12 may be overlapped.

Take the amounts of the first inorganic layers 13 and the organic layers 14 both being two as an example. As shown in FIG. 8, the first layer of the first inorganic layer 13, the first layer of the organic layer 14, the second layer of the first inorganic layer 13, the second layer of the organic layer 14 and the second inorganic layer 15 may be sequentially stacked on the organic light emitting layer 12 of the display panel 400. As shown in FIG. 9, the orthographic projection of the first recesses 131 of the first layer of the first inorganic layer 13 on the organic light emitting layer 12 and the orthographic projection of the first recesses 131 of the second layer of the first inorganic layer 13 on the organic light emitting layer 12 may be overlapped. The orthographic projection of the recesses 142 of the first layer of the organic layer 14 on the organic light emitting layer 12 and the orthographic projection of the recesses 142 of the second layer of the organic layer 14 may be overlapped. The orthographic projection of the second recesses 143 of the first layer of the organic layer 14 on the organic light emitting layer 12 and the orthographic projection of the second recesses 142 of the second layer of the organic layer 14 may be overlapped.

In practical applications, the amount of the first inorganic layers and the amount of the organic layers could be set according to the demand of various application scenarios. As long as they realize that concave-convex engagement may be formed between at least a pair of first inorganic layer and organic layer and concave-convex engagement may be formed between the organic layer and the second inorganic layer, they are all within the protection scope of the present disclosure.

The advantages of the present disclosure are that, in the display panel of the present disclosure, a layer among the first inorganic layer, the organic layer and the second inorganic layer may define a recess. Another layer among the first layer, the organic layer and the second layer adjacent to the layer may provide a protrusion. The protrusion may be engaged in the recess. A diameter of a tip of a protrusion may be larger than a diameter of a root of the protrusion. A shape of a space in the recess may match with a shape of the contour of the protrusion. Thus the bonding force between the first inorganic layer and the organic layer and the bonding force between the organic layer and the second inorganic layer may be increased, so that the encapsulation thin film may be more difficult to be peeled when the display panel may be bent, and the service life of the display panel may be increased.

The above are just implementations of the present disclosure, and do not exert any limitation to the patent scope of the present disclosure. Any equivalent structures or equivalent process transformations made with the disclosure of the present specification and the drawings, or directly or indirectly applied to other related technical fields are equally included in the patent protection scope of this disclosure.

What is claimed is:

1. A display panel, comprising:
a plurality of thin film layers;
wherein the plurality of thin film layers further comprises a first layer and a second layer adjacent to the first layer; the first layer defines a recess at a face toward the second layer, and the second layer further comprises a protrusion at a face toward the first layer, the protrusion is engaged in the recess, a diameter of a tip of the protrusion is larger than a diameter of a root of the protrusion, a shape of a space in the recess matches with a contour of the protrusion.

2. The display panel according to claim 1, wherein a vertical cross-section outline of the protrusion is a curved line.

3. The display panel according to claim 2, wherein the vertical cross-section outline of the protrusion comprises two side edges arranged symmetrically and an end edge connecting the two side edges, the side edge comprises a first arc and a second arc connecting to each other, opening directions of the first arc and the second arc are opposite to each other.

4. The display panel according to claim 1, further comprising an organic light emitting layer and an encapsulation layer arranged on the organic light emitting layer;
wherein the encapsulation layer comprises a plurality of thin film layers.

5. The display panel according to claim 4, wherein the plurality of thin film layers comprises a first inorganic layer, an organic layer and a second inorganic layer stacked successively; wherein the first inorganic layer is in contact with the organic light emitting layer.

6. The display panel according to claim 5, wherein the first inorganic layer defines a plurality of recesses, and the organic layer defines a plurality of recesses at side faces away from the organic light emitting layer, the second inorganic layer provides a plurality of protrusions, and the organic layer provides a plurality of protrusions at side faces toward the organic light emitting layer, a depth of the recesses of the first inorganic layer is less than a depth of the recesses of the organic layer.

7. The display panel according to claim 6, wherein an orthographic projection of the recesses of the first inorganic layer on the organic light emitting layer and an orthographic projection of the recesses of the organic layer on the organic light emitting layer are misaligned.

8. The display panel according to claim 5, wherein a distribution density of the recesses of the first inorganic layer and the organic layer corresponding to a middle region of the display panel is larger than a distribution density of the recesses corresponding to an edge region around the middle region.

9. The display panel according to claim 5, wherein a depth of the recesses of the first inorganic layer and the organic layer corresponding to a middle region of the display panel is larger than a depth of the recesses corresponding to an edge region around the middle region.

10. The display panel according to claim 5, wherein the amount of the first inorganic layers is at least two, the amount of the organic layers is at least two, the first inorganic layers and the organic layers are alternatively arranged with each other.

11. The display panel according to claim 10, wherein orthographic projections of the recesses of each layer of the first inorganic layers on the organic light emitting layer are overlapped, orthographic projections of the recesses of each layer of the organic layers on the organic light emitting layer are overlapped.

12. The display panel according to claim 5, wherein the first inorganic layer provides a plurality of the protrusions, and the organic layer provides a plurality of the protrusions at side faces away from the organic light emitting layer, the protrusions are integrally formed with the corresponding first inorganic layer and the organic layer.

13. The display panel according to claim 5, wherein the first inorganic layer defines a plurality of first recesses at side face away from the organic light emitting layer, the organic layer provides a plurality of first protrusions at side face toward the organic light emitting layer, the first protrusions are engaged in the first recesses.

14. The display panel according to claim 5, wherein the organic layer defines a plurality of second recesses at a side face away from the organic light emitting layer, the second inorganic layer provides a plurality of the second protrusions at a side face close to the organic light emitting layer, the second protrusions are engaged in the second recesses.

15. The display panel according to claim 5, wherein a material of the first inorganic layer and a material of the second inorganic layer is one of oxidation silicon, silicon nitride and silicon oxynitride, a material of the organic layer is one of epoxy-based material and acrylic-based material.

* * * * *